United States Patent
Chindalore

(10) Patent No.: US 7,151,302 B1
(45) Date of Patent: Dec. 19, 2006

(54) METHOD AND APPARATUS FOR MAINTAINING TOPOGRAPHICAL UNIFORMITY OF A SEMICONDUCTOR MEMORY ARRAY

(75) Inventor: Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/165,736

(22) Filed: Jun. 24, 2005

(51) Int. Cl.
*H01L 29/76* (2006.01)

(52) U.S. Cl. .................. 257/401; 257/127; 257/170; 257/452; 257/457

(58) Field of Classification Search ................ 257/401, 257/127, 170, 452, 457, 484
See application file for complete search history.

(56) References Cited

U.S. PATENT DOCUMENTS

| | | | |
|---|---|---|---|
| 6,358,816 B1 | 3/2002 | Singh et al. | |
| 6,406,976 B1 | 6/2002 | Singh et al. | |
| 6,483,749 B1* | 11/2002 | Choi et al. | 365/185.18 |
| 6,690,067 B1* | 2/2004 | Ker et al. | 257/355 |
| 6,879,045 B1 | 4/2005 | Ireland | |
| 2004/0171243 A1 | 9/2004 | Lee et al. | |
| 2005/0023617 A1* | 2/2005 | Schoellkopf et al. | 257/382 |
| 2005/0035416 A1* | 2/2005 | Kuroda et al. | 257/401 |
| 2006/0011964 A1* | 1/2006 | Satou | 257/306 |

* cited by examiner

*Primary Examiner*—Thao P. Le
(74) *Attorney, Agent, or Firm*—Daniel D. Hill

(57) ABSTRACT

A semiconductor device includes a memory array having a plurality of non-volatile memory cells. Each non-volatile memory cell of the plurality of non-volatile memory cells has a gate stack. The gate stack includes a control gate and a discrete charge storage layer such as a floating gate. A dummy stack ring is formed around the memory array. An insulating layer is formed over the memory array. The dummy stack ring has a composition and height substantially the same as a composition and height of the gate stack to insure that a CMP of the insulating layer is uniform across the memory array.

15 Claims, 3 Drawing Sheets

METHOD AND APPARATUS FOR MAINTAINING TOPOGRAPHICAL UNIFORMITY OF A SEMICONDUCTOR MEMORY ARRAY

FIELD OF THE INVENTION

This invention relates in general to semiconductor devices, and more particularly, to a semiconductor device and a process for maintaining topographical uniformity of a memory array during chemical mechanical polishing.

RELATED ART

During the manufacture of a semiconductor device, it may be necessary to planarize the surface of the semiconductor device as one or more of the manufacturing steps. Chemical Mechanical Polishing (CMP) is one such process used to planarize surfaces of semiconductor devices. However, it is difficult to guarantee uniformity of the planarization because of varying layouts on the semiconductor device.

A memory array is typically one of the more dense areas of an integrated circuit layout. As part of a manufacturing process of the memory array, an interlevel dielectric (ILD) is deposited over the memory cells to insulate the memory cells from the first metal layer. Deposition of the dielectric material typically results in an uneven surface. The uneven surface is typically planarized using a CMP process before the metal layer is formed. Because the array layout is typically denser and may be higher than the adjacent peripheral circuit layout, more dielectric material may be removed from the edges of the array than from the center of the array as the CMP transitions to the lower peripheral circuit layout, resulting in less dielectric material over the edge or the array than the center of the array. The non-uniformity in thickness, caused by interactions between the memory array layout and the polishing process, can result in reliability issues such as electrical opens, high resistance contacts, electrical shorts, or other leakage paths in the array.

Traditionally, tiling has been used in the manufacture of semiconductor devices to help solve the varying height problem of the dielectric material. Tiles are printed dummy features used to fill in the low areas or less dense areas of the layout to insure a uniform surface during CMP. However, because of the greater layout density of the memory array, tiles generally cannot be used within the memory array.

Therefore, a need exists for a way to provide for better topographical uniformity of the ILD over a semiconductor memory array.

BRIEF DESCRIPTION OF THE DRAWINGS

The present invention is illustrated by way of example and not limited in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Generally, the present invention provides a semiconductor device and method for insuring more uniform planarization of an ILD over a semiconductor substrate having an active area with relatively densely spaced non-volatile memory cells. The non-volatile memory cells are surrounded by a dummy ring. The dummy ring insures that there is uniform planarization of the ILD during CMP so that the thickness of the ILD at an edge of the array is the same as the thickness at a central portion of the array. In the illustrated embodiment, the dummy ring has a height and composition that matches the height and composition of the gate stack. In one embodiment, the gate stack includes a floating gate. In other embodiments, the gate stack may include another type of discrete charge storage layer such as a layer comprising nanocrystals or a nitride. Also, in another embodiment, the dummy ring may be discontinuous and still provide topographical uniformity between the edge and center portions of the plurality of memory cells. The present invention is defined by the claims and is better understood after reading the rest of the detailed description.

Figure 1:
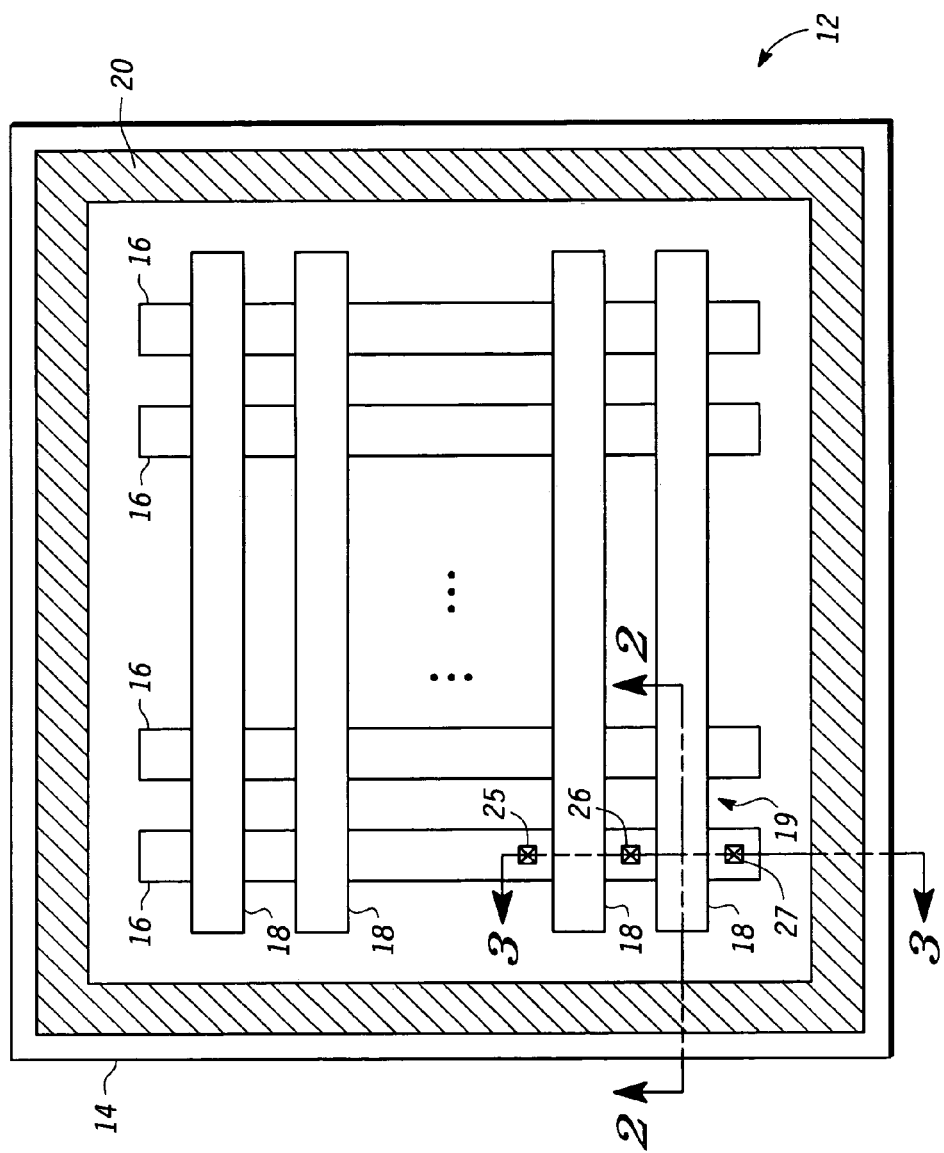
FIG. 1 illustrates a top view of a portion of a semiconductor device in accordance with one embodiment of the present invention.

FIG. 1 illustrates a top view of a portion of a semiconductor device 10 in accordance with one embodiment of the present invention. The semiconductor device 10 includes a memory array 12 as an example of dense active features. For purposes of the discussing the illustrated embodiment, "dense active features" means an active feature layout that is too dense to allow the use of tiling or the insertion of dummy features. Note that active features are features that correspond to the designed circuitry for a semiconductor device. The active features include portions of transistors, capacitors, resistors, or the like. Active features include power supply features, which are designed to operate at a substantially constant potential, and signal features, which are designed to operate at one potential under one set of electronic conditions and a different potential at another set of electronic conditions. In addition to memory array 12, the semiconductor device 10 may include other circuits not illustrated in FIG. 1 such as digital or analog circuits having a lower feature density that allows the use of tiles or dummy features.

Memory array 12 includes a plurality of parallel longitudinal active areas 16 formed in a semiconductor substrate, and a plurality of word lines 18 formed perpendicular to the active areas 16. In the illustrated embodiment, memory array 12 includes a plurality of conventional floating gate non-volatile memory cells. A memory cell is formed at the intersection of each word line 18 and active area 16. Contacts, such as contacts 25, 26, and 27, are formed to couple the current electrodes of the memory cells to bit lines implemented in a metal layer above the memory array 12 (not shown). In FIG. 1, only three contacts 25, 26, and 27 are illustrated for the purposes of simplicity and clarity; however, each of the memory cells in FIG. 1 include contacts. In other embodiments, different types of memory arrays may be used for memory array 12 including for example, static random access memory (SRAM), dynamic random access memory (DRAM), magneto random access memory (MRAM) arrays, ferroelectric random access memory (FE-RAM) arrays, and the like.

Each of the plurality of longitudinal active areas 16 is surrounded and isolated from each other by trenches 19. The trenches 19 may be formed by any of several known techniques. For example, in one technique, a resist layer mask is deposited followed by an etch step. The depth of the trenches can vary and are filled with a dielectric material.

An active boundary 14 surrounds the memory array 12. The active boundary 14 is formed by etching a trench around the array 12 resulting in a structure similar to active areas 16. In one embodiment, the active boundary 14 may be approximately 2 microns wide and has the same height as the active areas in the array 12. The active boundary 14 width may be different in other embodiments. The active boundary 14 provides support for the edge of the array during a CMP of the dielectric material filling the trenches to insure a uniform topography of the dielectric material.

A dummy stack ring 20 is formed on active boundary 14. The dummy stack ring 20 has a width smaller than the width of the active boundary 14, and may be between about 0.5 and 2 microns wide. The dummy stack ring 20 has the same composition and height as a gate stack of the memory array 12. However, the dummy stack ring 20 will not have etched shapes like the gate stacks of the memory array 12 and will be self-aligned. Also, the dummy stack ring 20 is electrically isolated from the active areas 16; however, in other embodiments, the dummy stack ring 20 may be coupled to a power supply voltage terminal such as ground. After the gate stacks and the dummy stack ring 20 are formed, a relatively thick ILD layer (see FIG. 2 and FIG. 3) is deposited to support and isolate a first metal layer. The dummy stack ring 20 provides support for the edge of the array 12 during a CMP of the ILD layer to insure a uniform topography of the ILD layer across the array 12. Insuring a uniform CMP across the array 12 reduces reliability issues such as electrical opens, high resistance contacts, electrical shorts, or other leakage paths in the array 12.

Figure 2:
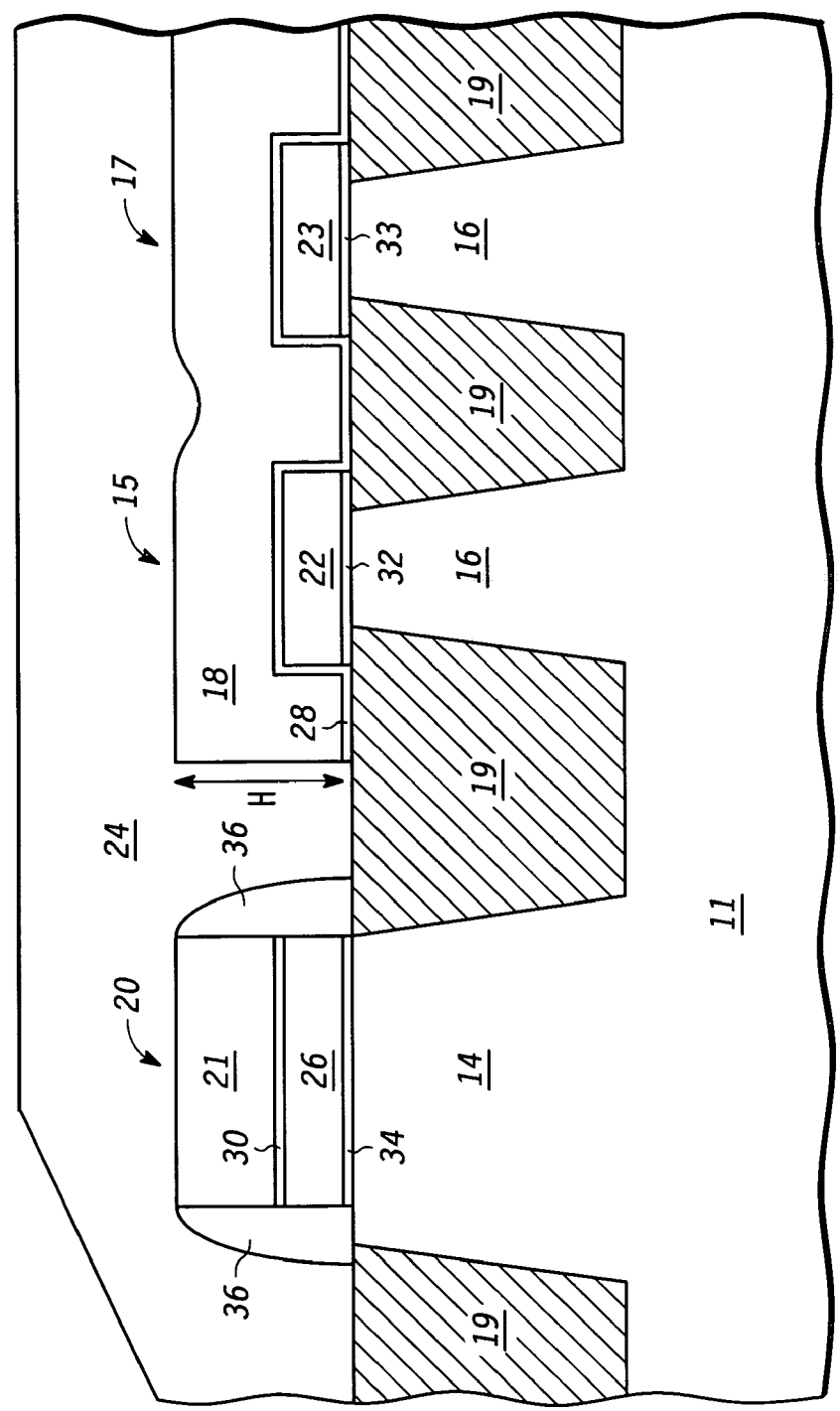
FIG. 2 illustrates a cross-sectional view of the semiconductor device of FIG. 1 along the line 2—2.

FIG. 2 illustrates a cross-sectional view of the semiconductor device 10 of FIG. 1 along the line 2—2. As can be seen in FIG. 2, the trenches 19 are etched into a semiconductor substrate 11 to form the active areas 16 and the active boundary 14. The semiconductor substrate 11 may be silicon or another semiconductor material such as gallium arsenide may be used. The trenches 19 are filled with a dielectric material and then polished flush with the tops of the active boundary 14 and active areas 16. The dielectric material is illustrated in FIG. 2 with cross-hatching in the trenches 19. The gate stacks, such as gate stacks 15 and 17 are formed on the active areas 16 for the memory array 12. Source and drain regions will also be diffused into active areas 16 on either side of each of the gate stacks (not shown). To form the gate stacks, tunnel oxide layers 32 and 33 are formed over the respective active areas 16. Floating gate 22 is formed on tunnel oxide layer 32 and floating gate 23 is formed on tunnel oxide 33. The illustrated embodiment uses floating gates as charge storage layers. Other embodiments may use another form of discrete charge storage layer, such as for example, a nitride layer or a layer having nanocrystals. An oxide-nitride-oxide (ONO) layer 28 is formed over the floating gates 22 and 23. A polysilicon word line 18 is formed over the gate stacks 15 and 17. A portion of the word line 18 directly over the floating gates 22 and 23 functions as control gates for the memory cells.

The dummy stack ring 20 has the same composition as gate stacks 15 and 17 and is formed at the same time that gate stacks 15 and 17 are formed using the same process steps. Dummy stack ring 20 includes a tunnel oxide 34, a floating gate 26, an ONO layer 30, and a polysilicon layer 21. Providing a dummy stack ring with the same composition as the gate stacks 15 and 17 insures that the dummy stack ring will have the same height as the gate stacks, labeled "H" in FIG. 2.

Nitride sidewall spacers, such as sidewall spacers 36 are formed on the sides of the gate stacks and the active boundary 20. The nitride sidewall spacers are illustrated on the sides of gate stacks in FIG. 3.

An ILD layer 24 is deposited over the semiconductor device 10. In the illustrated embodiment, ILD layer 24 is high density plasma (HDP) undoped silicate glass (USG). In other embodiments the ILD layer 24 may be another conventional deposited oxide such as TEOS. The ILD layer 24 is planarized using a conventional CMP process and conventional CMP slurry. After being planarized the ILD 24 slopes down on the side of active boundary 20 opposite the array 12 because the double-polysilicon gate stacks of array 12 are higher than the single-polysilicon circuitry on semiconductor device 10. As can be seen in FIG. 2, the active boundary 20 insures that the CMP of ILD 24 is uniform over the entire memory array 12.

Figure 3:
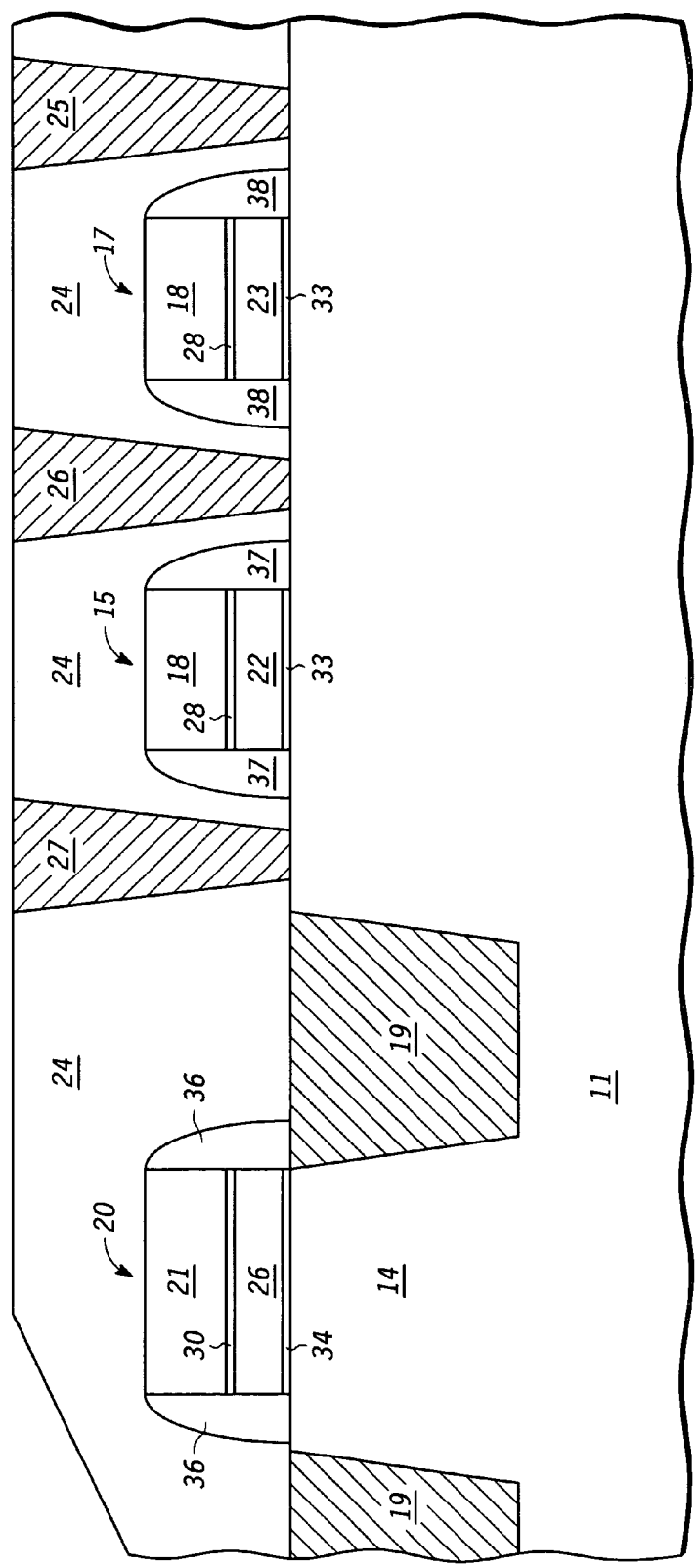
FIG. 3 illustrates a cross-sectional view of the semiconductor device of FIG. 1 along the line 3—3.

FIG. 3 illustrates a cross-sectional view of the semiconductor device 10 of FIG. 1 along the line 3—3. In FIG. 3, sidewall spacers 37 can be seen on the sides of gate stack 15 and side wall spacers 38 can be seen on the sides of gate stack 17. Source and drain regions (not shown) are diffused into the active areas 16 are both sides of the gate stacks. Contacts 25, 26, and 27 are formed in vias through ILD 24 to connect to one or more metal layers (not shown) formed above ILD 24.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
   an active area formed in a semiconductor substrate;
   a plurality of non-volatile memory cells formed in the active area, each of the plurality of non-volatile memory cells having a source, a drain, and a gate stack, the gate stack comprising:
   a first oxide layer formed over the active area;
   a discrete charge storage layer formed over the first oxide layer;
   an second oxide layer formed over the discrete charge storage layer; and
   a control gate formed over the second oxide layer; and
   a ring formed around the plurality of memory cells, the ring having a composition and height substantially the same as a composition and height of the gate stack.

2. The semiconductor device of claim 1, wherein the discrete charge storage layer is a floating gate.

3. The semiconductor device of claim 1, wherein the ring is electrically isolated from the plurality of memory cells.

4. The semiconductor device of claim 1, wherein the ring is continuous.

5. The semiconductor device of claim 1, wherein the active area is surrounded by a trench etched into the semiconductor substrate.

6. The semiconductor device of claim 1, further comprising an active boundary formed around the memory array, wherein the ring is formed directly over the active boundary.

7. The semiconductor device of claim 1, further comprising a nitride spacer formed on a side of the ring.

8. The semiconductor device of claim 1, wherein the first oxide comprises a tunnel oxide and the second oxide comprises an oxide-nitride-oxide (ONO) stack.

9. The semiconductor device of claim 1, wherein the active area comprises a plurality of longitudinal active regions, each of the longitudinal active regions surrounded by trenches.

10. The semiconductor device of claim 1, further comprising an insulating layer formed over the plurality of memory cells and over the ring, wherein a chemical mechanical polishing process is used to planarize the insulating layer.

11. A semiconductor device comprising:
a memory array having a plurality of non-volatile memory cells, each non-volatile memory cell of the plurality of non-volatile memory cells having a gate stack, the gate stack including a control gate and a discrete charge storage layer; and
a dummy stack ring formed around the memory array, the dummy stack ring having a composition and height substantially the same as a composition and height of the gate stack.

12. The semiconductor device of claim 11, wherein the dummy stack ring is continuous.

13. The semiconductor device of claim 11, wherein the plurality of non-volatile memory cells is formed on a plurality of parallel longitudinal active regions, each of the longitudinal active regions surrounded by trenches.

14. The semiconductor device of claim 11, wherein the discrete charge storage layer comprises a floating gate.

15. The semiconductor device of claim 11, further comprising an insulating layer formed over the plurality of non-volatile memory cells and over the dummy stack ring, wherein a chemical mechanical polishing process is used to planarize the insulating layer.

* * * * *